United States Patent [19]
Chang

[11] Patent Number: 5,261,157
[45] Date of Patent: Nov. 16, 1993

[54] ASSEMBLY OF ELECTRONIC PACKAGES BY VACUUM LAMINATION

[75] Inventor: Kin-Shiung Chang, Meriden, Conn.

[73] Assignee: Olin Corporation, New Haven, Conn.

[21] Appl. No.: 643,637

[22] Filed: Jan. 22, 1991

[51] Int. Cl.⁵ .......................... H01R 9/00; B29C 65/00
[52] U.S. Cl. ......................................... 29/844; 29/842; 156/285; 174/52.4
[58] Field of Search ................. 29/842, 844, 854, 855, 29/856, 883; 174/52.4; 156/285, 313

[56] References Cited

U.S. PATENT DOCUMENTS

| | | | |
|---|---|---|---|
| 4,451,317 | 5/1984 | Oizumi et al. | 156/307.3 |
| 4,688,152 | 8/1987 | Chia | 361/408 |
| 4,816,426 | 3/1989 | Bridges et al. | 437/207 |
| 4,821,151 | 4/1989 | Pryor et al. | 361/403 |
| 4,888,449 | 12/1989 | Crane et al. | 174/52.4 |
| 4,897,508 | 1/1990 | Mahulikar et al. | 174/52.4 |
| 4,939,316 | 5/1990 | Mahulikar et al. | 174/52.4 |
| 4,965,227 | 10/1990 | Chang et al. | 437/207 |
| 4,970,781 | 11/1990 | Chang et al. | 29/843 |
| 5,108,532 | 4/1992 | Thein et al. | 156/285 |

OTHER PUBLICATIONS

Hinton, Pressing Flex and Rigid-Flex in a Vacuum Press, appearing in Circuit World. vol. 13, No. 2 (1987) pp. 46-47.

Primary Examiner—P. W. Echols
Attorney, Agent, or Firm—Gregory S. Rosenblatt; Paul Weinstein

[57] ABSTRACT

A process for the assembly of a pin grid array electronic package by vacuum lamination is provided. A vacuum is applied to the package components at the same time the components are bonded with a dielectric sealant. The sealant flow into holes formed in the package base is improved thereby electrically isolating terminal pins which pass through the holes.

17 Claims, 3 Drawing Sheets

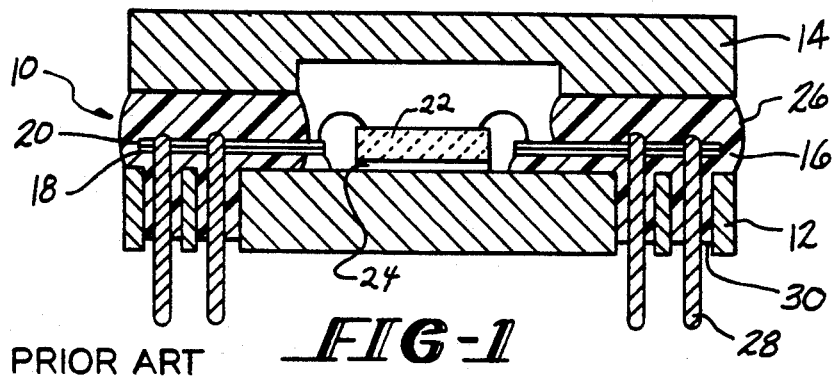
PRIOR ART  FIG-1
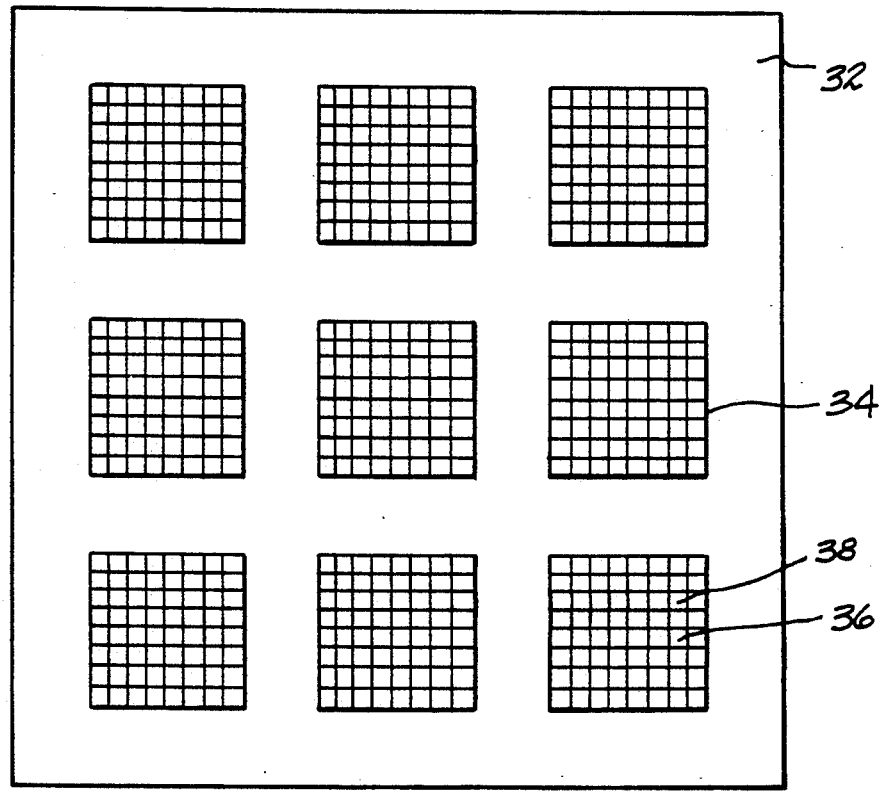
FIG-2
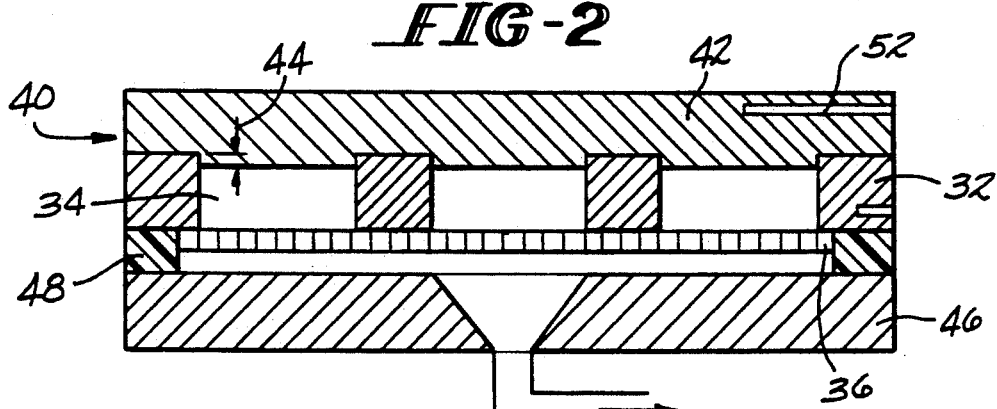
FIG-3

ASSEMBLY OF ELECTRONIC PACKAGES BY VACUUM LAMINATION

CROSS REFERENCE TO RELATED APPLICATION

This application relates to U.S. patent application Ser. No. 442,877 entitled "Metal Pin Grid Array Package" by Deepak Mahulikar, filed Nov. 29, 1989. now U.S. Pat. No. 5,103,292.

BACKGROUND OF THE INVENTION

While the invention is subject to a wide range of applications, it is particularly suited for the assembly of electronic packages. In particular, the invention relates to the assembly of metal pin grid array packages by vacuum lamination.

Microelectronic devices are typically manufactured from a semiconductor material such as silicon, germanium or gallium/arsenide. The semiconductor material is fashioned into a die, a generally rectangular structure having circuitry formed on one surface. Along the periphery of that surface are input/output pads to facilitate electrical interconnection to external components.

The device is brittle, requiring protection from moisture and mechanical damage. The protection is provided by an electronic package. The package further contains electrical conductors to transport electrical pulses between the device and external circuitry.

One package design which minimizes space requirements and provides a high density of electrical interconnections is a pin grid array (PGA) package. One pin grid array package has a multilayer ceramic substrate with conductive circuitry disposed between the layers. The circuitry terminates at conductive pads to which terminal pins are brazed. The pins are configured in a regular array. U.S. Pat. No. 4,821,151 to Pryor et al. discloses a ceramic pin grid array package.

A molded plastic pin grid array package is disclosed in U.S. Pat. No. 4,688,152 to Chia. A printed wire board having plated through holes forms the package base. An integrated circuit device is bonded to one face of the printed circuit board. Lead wires electrically interconnect the device to circuit traces patterned on the board. The circuit traces terminate at conductive rings containing terminal pins which pass through the board. The surface containing the integrated circuit, wire bonds and circuit traces is then encapsulated in a molding resin.

Another molded plastic pin grid array package is disclosed in U.S. Pat. No. 4,965,227 to Chang et al. A circuit tape having terminal pins is soldered to circuit traces supported by a dielectric layer. The terminal pins and circuit tape are then partially encapsulated in a polymer resin.

Ceramic pin grid array packages have excellent reliability. However, the ceramic packages are brittle, expensive and poor conductors of heat. One advantage of pin grid array packages is a high density of electrical connections. The high density allows the housing of complex integrated circuits and hybrid devices which generate heat during operation. If the heat is not removed, the device operating life is shortened. It has been estimated that for every 10° C. increase in operating temperature, the effective operating life is decreased by fifty percent.

Plastic pin grid array packages are not as brittle and are cheaper to manufacture than ceramic packages. The thermal performance of a plastic PGA may be enhanced by molding a metallic heat spreader into the body of the package. The large surface area of exposed plastic makes plastic PGA packages susceptible to moisture permeation.

One package which provides moisture resistance and reliability at a reduced cost with high thermal performance is a metal PGA. A metal PGA is disclosed in U.S. Pat. No. 5,103,292 which is incorporated herein in its entirety. The metal PGA has a metallic base with an ordered array of holes. The package cover is usually made from the same metal as the base. A circuit tape is disposed between the base and cover. A plurality of terminal pins are electrically interconnected to the circuit tape. The terminal pins extend outwardly through the ordered array of holes in the package base. A dielectric bonds the cover component to both the circuit tape and to the base component, as well as the base component to the circuit. The dielectric extends into the ordered array of holes electrically isolating the pins from the base.

The package base is preferably a metal with high thermal conductivity such as a copper or aluminum alloy. The electronic device is bonded to the base so the entire base is a heat spreader. Thermal conduction is improved over that obtained by molding a heat spreader into the base of a plastic PGA.

The dielectric is preferably a polymer adhesive such as a thermosetting epoxy. During assembly, the adhesive flows into the ordered array of holes formed in the base electrically isolating the terminal pins from the base. To optimize the performance of the metal PGA, adhesive reaction products must be eliminated or removed. During bonding, the polymerization of the epoxy resin generates reaction by-products. Residual contaminants such as chlorides and bromides are present from the manufacture of the adhesive. In the presence of water vapor, the by-products and residual contaminants form corrosive acids such as hydrochloric acid are formed. The corrosive acids may dissolve device metallization or corrode the wire bonds.

The terminal pins are electrically isolated from the metallic base by the adhesive. The electrical conductivity of the holes is reduced by depositing an anodization layer or other electrically resistive barrier on the walls, but primary insulation is provided by the adhesive. It is therefore desirable to maximize the flow of adhesive into the holes.

Vacuum lamination has been used to manufacture flexible and rigid printed wiring boards. The process has not been applied to the assembly of a PGA. With the incorporation of novel fixturing, vacuum lamination may be applied to the assembly of metal pin grid array packages.

Accordingly, it is an object of the invention to provide a fixture for the vacuum lamination of a pin grid array package. It is a further object of the invention to provide a method for the assembly of pin grid array packages which utilizes vacuum lamination. It is a feature of the invention that the fixture comprises a cavity plate, cover plate and grid hole plate. Yet another feature of the invention is that a vacuum is applied to the base of the package through the grid hole plate.

It is a benefit of the invention that the polymer resin is drawn into the ordered array of holes formed in the package base for enhanced electrical resistance. Yet another advantage of the invention is that the concentration of volatile reaction by-products is reduced. Still another benefit of the invention is that the number of voids in the polymer is reduced. A further benefit of the invention is that fixturing provides exact positioning of the package components. A stop in the cover plate assures uniform thickness. Another benefit of the invention is that vacuum lamination may be applied to adhesively sealed dual-in-line (DIP) packages.

In accordance with the invention, there is provided both a fixture for the assembly of pin grid array packages and a method of manufacture. The fixture is formed from a grid plate having a plurality of holes extending from a first side to a second side. A cavity plate having at least one aperture to receive a pin grid array assembly is supported by the first side of the grid plate. The fixture includes both a means to heat the assembly and a means to draw a vacuum on the grid plate.

The method of assembly includes the step of providing a package assembly. The package assembly contains a base component having a first array of holes, a cover component and a circuit disposed between the base and cover components. The circuit has an array of terminal pins electrically interconnected. The terminal pins pass through the first array of holes. A dielectric sealing means is disposed between the base component and the circuit. A second dielectric sealing means is disposed between the cover component and the circuit. A vacuum is applied to the base component. The package assembly is then heated to a temperature sufficient to cause the first and second dielectric sealing means to flow and to bond the base component to both the circuit and to bond the cover component to both the circuit and the base component.

The above stated objects, features and advantages will become more clear from the specification and drawings which follow.

BRIEF DESCRIPTION OF THE DRAWINGS

FIG. 1 shows in cross-sectional representation a metal PGA package as known from the prior art.

FIG. 2 shows in top planar view a grid plate and a cavity plate in accordance with an embodiment of the invention.

FIG. 3 shows in cross-sectional representation a grid plate, cavity plate and cover plate for vacuum lamination in accordance with an embodiment of the invention.

DETAILED DESCRIPTION OF THE INVENTION

Figure 4:
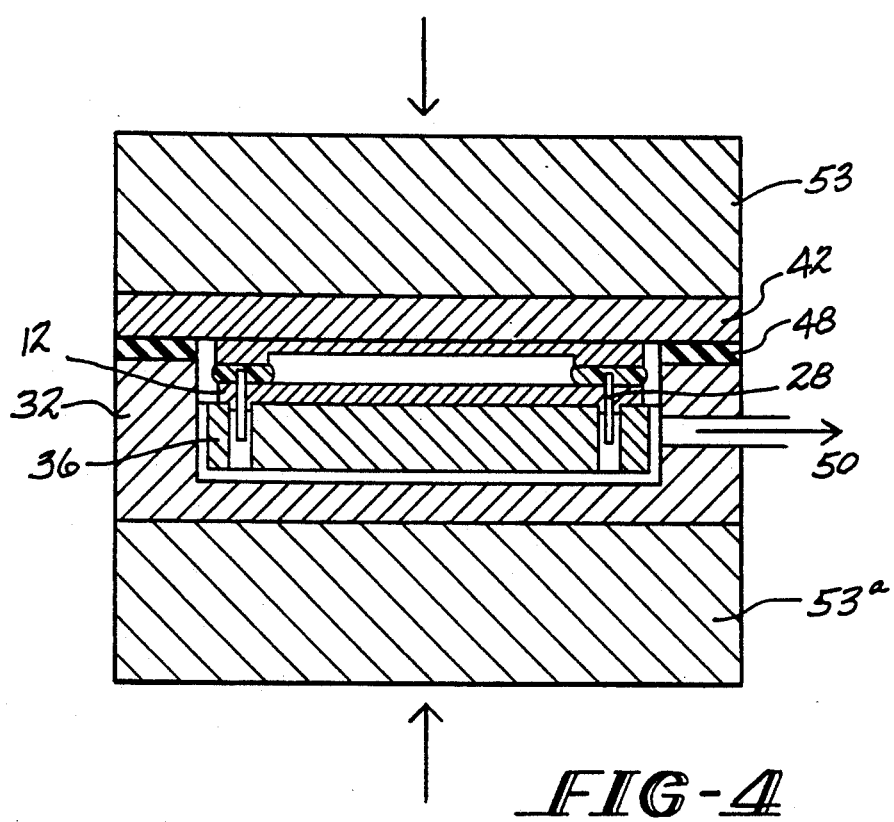
FIG. 4 shows in cross-sectional representation heated platens for applying heat and pressure to the fixture during assembly.

FIG. 1 shows in cross-sectional representation a metal pin grid array package 10 as known from the prior art. The metal PGA contains a metallic base component 12 which is preferably a good thermal conductor such as copper, aluminum or an alloy thereof. A cover component 14 seals the package. The cover component 14 is preferably formed from the same metal as forms the base 12 to avoid a mismatch in coefficient of thermal expansion preventing flex during cooling or heating. Alternatively, the cover component 14 may be formed from a ceramic for increased rigidity and reduced weight.

Disposed between the metallic base 12 and cover 14 is a circuit tape 16. The circuit tape 16 is comprised of a dielectric support layer 18, such as a polyimide and a conductive layer 20. One preferred conductor for the conductive layer 20 is copper with a thickness of from about 1 to about 1.4 mils. The conductive layer 20 is patterned, such as by photolithography, into a desired circuit pattern. Frequently, there will be more than one conductive layer 20 separated by additional dielectric layers forming a multilayer circuit tape.

An electronic device 22 is bonded to the metallic base component 12 through the use of a compliant die attach 24. One suitable compliant die attach 24 is a silver filled epoxy.

A dielectric sealant 26 bonds the metallic base component 12 to both the circuit tape 16 and the cover component 14, as well as the cover component 14 to the circuit tape 16. The dielectric sealant 26 is preferably a polymer such as a thermosetting epoxy. One suitable dielectric sealant is XEA9485NM manufactured by Hysol Corporation, Pittsburg, Calif.

The dielectric sealant 26 may also be a sealing glass. The glass has a coefficient of thermal expansion close to that of the metallic base component 12 and cover component 14. The glass sealing temperature is sufficiently low so the dielectric support layer 18 does not degrade during glass cure.

Terminal pins 28 are electrically connected to the circuit tape 16 such as by soldering to the conductive layer 20. The terminal pins 28 pass through apertures 30 in the metallic base component 12. During bonding, the dielectric sealant 26 flows into apertures 30 to electrically isolate the terminal pins 28 from the metallic base component 12.

Vacuum lamination improves the flow of dielectric sealant 26 into apertures 30. As shown in FIG. 2, vacuum lamination requires a cavity plate and a grid plate. The cavity plate 32 has at least one aperture 34 for receiving pin grid array assemblies. The perimeter, the length and width of the aperture 34, is slightly larger than the perimeter of the base component of the pin grid array. Sufficient clearance is provided between the walls of the aperture 34 and the PGA base component to permit easy insertion and removal of the PGA and to compensate for changes in the dimensions when heated due to thermal expansion. Package components are preferably copper and aluminum, both metals with high coefficients of thermal expansion, so sufficient clearance must be provided.

Conversely, the walls of the aperture 34 align the package components. To maintain the desired tolerances, the spacing between package components and the walls of the aperture 34 should be minimized. In a preferred embodiment utilizing a stainless steel cavity plate 32 and aluminum alloy 3003 package components, the length and width of the aperture 34 should each be from about 0.002 to about 0.015 inches larger than the length and width of the package base.

The cavity plate 32 is manufactured from an easy to machine metal having good thermal conductivity. The metal should not oxidize or otherwise react at the bonding temperature of the dielectric sealant, typically between about 175° C. and 200° C. High thermal conductivity is desirable. In one embodiment, the package assembly is heated to the bonding temperature by heating the cavity plate. Preferred materials include, but are not limited to aluminum, aluminum alloys, steel and stainless steel.

A grid plate 36 is in intimate contact with a first side of the cavity plate 32. The contact between the grid plate and the cavity plate is sufficiently secure to prevent the loss of excess vacuum at the interface. A temporary bonding means such as screws or locating pins is preferred. Optionally, a flexible gasket such as silicone rubber may be disposed between the grid plate 36 and cavity plate 32 to improve the heremeticity of the bond.

The grid plate 36 comprises a metallic plate having a plurality of holes 38. The holes 38 are preferably positioned in a uniform array. The center to center distance between holes 38 is that required for a selected terminal pin configuration. Most standard PGA configurations require a pin to pin spacing of 100 mils. However, some high density pin grid array packages require 50 mil spacing. The grid plate 36 is preferably a rigid screen having hole dimensions slightly larger than the diameter of the terminal pins, about 16 to 20 mils, and center to center spacings of either 50 mils or 100 mils. The most effective thickness for the grid plate is on the order of the length of the terminal pins, from about 50 to about 200 mils. The holes 38 support the pin shafts during package assembly so that the shafts remain perpendicular to the base of the electronic package. In the event, the preferred grid plate dimensions are difficult to achieve from a screen, other forms of grid plates such as a machined or etched plate may be utilized.

The grid plate is preferably formed from the same material as the cavity plate 32 to eliminate positioning changes during heating caused by different rates of thermal expansion.

The grid plate 36 is universal and may be used for all PGA's having either 50 or 100 mil pin to pin spacings. The cavity plate 32 is limited to pin grid arrays having a base suitable for the specific cavity plate aperture 34. The grid plate 36 is interchanged between cavity plates 32 having various sized apertures 34. FIG. 3 shows in cross-sectional representation a vacuum lamination fixture 40 incorporating the cavity plate 32 and grid plate 36.

The base of the PGA seals the grid plate. Better sealing is obtained by using a cover plate 42. The cover plate 42 seals the cavity plate aperture 34. The cover plate 42 preferably extends into the cavity plate aperture 34 by a distance 44. The distance 44 is selected so that the cover plate 42 applies a uniform pressure to the pin grid array package assembly during the dielectric cure. Each assembly is under uniform pressure resulting in a consistent thickness with a minimum number of voids and reduced adhesive bleed out.

A vacuum fixture 46 is hermetically sealed to the second side of the grid plate 36. The seal may be to either the grid plate 36 or to the cavity plate 32 as shown in FIG. 3. A gasket 48 preferably seals the vacuum fixture 46 to the cavity plate 32. A means (not shown) such as a pump is employed to draw a vacuum 50 on the second side of the grid plate 36.

The vacuum reduces voids in the cured adhesive. The vacuum also draws the adhesive resin into the gaps between the terminal pins and the walls of the base component of the PGA for improved electrical isolation. The vacuum further draws volatiles released during curing away from the pin grid array package. The volatiles are not available to combine with moisture and form corrosive reactants.

Preferably, the vacuum is sufficient to cause the dielectric sealant to draw into the apertures in the base of the package, without deforming the package base or causing the dielectric sealant to foam. A vacuum pressure in excess of 10 mm/Hg is preferred. Preferably, the vacuum pressure is in the range of from about 1 to about 5 mm/Hg. However, it is recognized that at a sufficiently high temperature the adhesive will have such a low viscosity that a minimal pressure will be necessary to draw the adhesive into the base plate. It is within the scope of the invention to apply suction with minimal vacuum.

Some polymers contain air pockets or volatile residue. When a vacuum is drawn, the air pockets or volatile residue may expand leading to foaming. Foaming is minimized by pretreating the polymer adhesive in a vacuum prior to package sealing or by selecting a polymer adhesive which is resistant to foaming. Most epoxies are believed satisfactory for vacuum lamination. Other adhesive formulated from benzocyclobutene, bismaleimide triazine, cyanate triazine, cyanate ester, phenolic, polyether imide, silicone and polyimide may be more resistant to foaming and may be utilized.

The dielectric sealant is heated to a temperature sufficient to cause the sealant to bond to the package components and to flow into the aperture in the package base. The package may be heated by any suitable means. For example, the entire lamination fixture may be placed into an oven and heated to a suitable temperature, typically from about 175° C. to about 200° C. Alternatively, heating elements 52 such as electrical resistance heaters may be inserted into the thermally conductive cover plate 42 or the cavity plate 32 or both. In this way, the temperature of each PGA assembly may be accurately controlled.

A most preferred method of providing both heat to the pin grid array assembly and uniform pressure to the fixture is the use of a press having heated platens. As shown in FIG. 4, a press (not shown), which may be hydraulic or actuated by other means, drives upper heated platen 53 and lower heated platen 53$^a$ towards one another. At the same time, vacuum 50 is drawn on the fixture. Upper 53 and lower 53$^a$ platens compress cover plate 42 against cavity plate 32 with gasket 48 disposed between. The compression transmits a compressive pressure to the package assembly of from about 200 psi to about 1000 psi.

FIG. 4 further shows a cover plate 42 without protusions such that the package height is determined by the sidewalls of the cavity plate 32. Grid plate 36 is shown as thicker than the lengths of the terminal pins 28 to support and hold the pins perpendicular to the metallic base component 12 during sealing.

Figure 5:
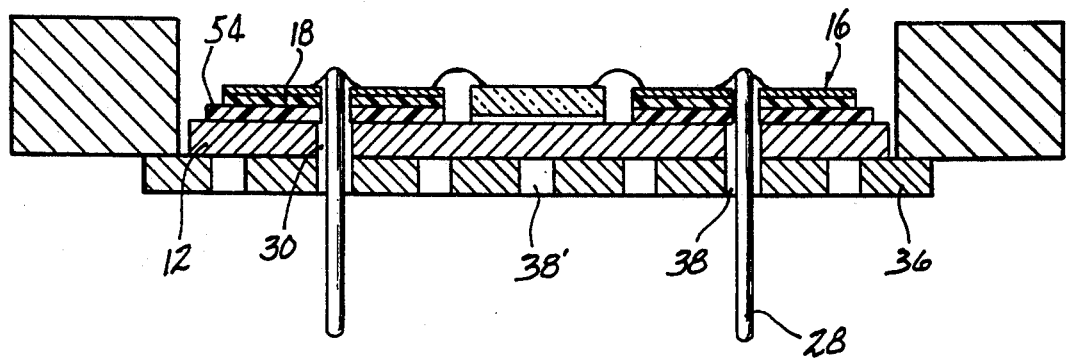
FIG. 5 shows in cross-sectional representation the partial loading of components in the vacuum lamination fixture of the invention.
Figure 6:
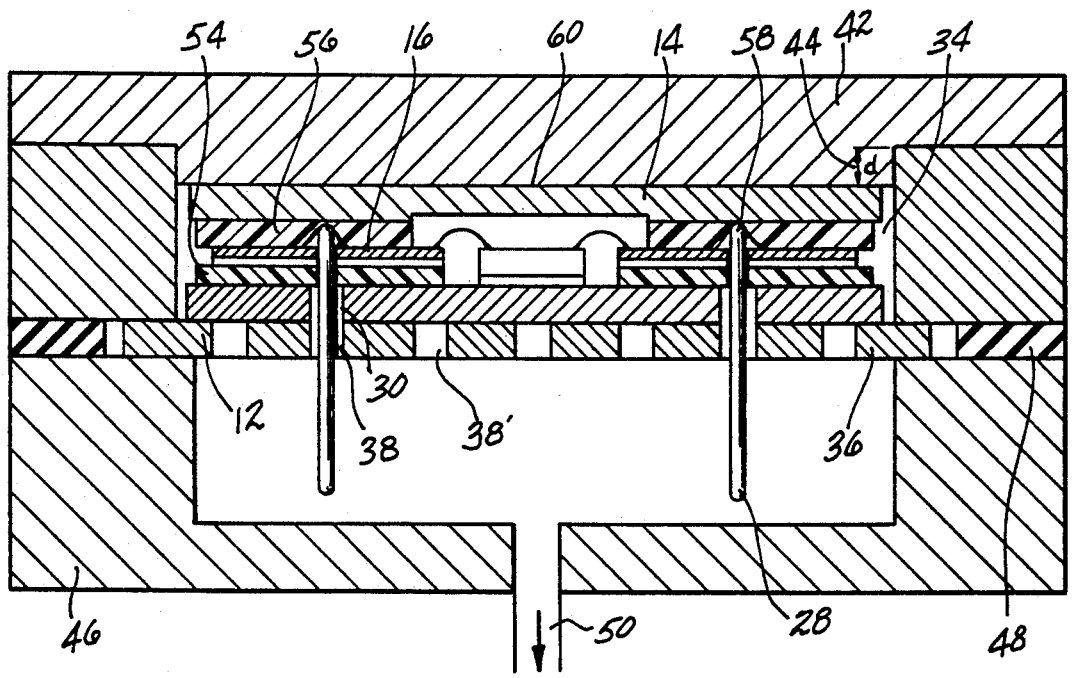
FIG. 6 shows in cross-sectional representation the assembly of a metal pin grid array package by vacuum lamination in accordance with the invention.

FIGS. 5 and 6 show in cross-sectional representation a process for the manufacture of a pin grid array package by vacuum lamination. With reference to FIG. 5, a metallic base component 12 is supported by grid plate 36. The metallic base component 12 contains an ordered array of holes 30 defining a desired terminal pin configuration. A circuit tape 16 having presoldered terminal pins 28 is placed in alignment with the metallic base component 12. The terminal pins 28 are positioned to pass through the ordered array of holes 30 formed in the metallic base plate 12, as well as through the apertures 38 in the grid plate 36. The apertures 38 in the grid plate 36 are universal and can accommodate any configuration of terminal pins 28. Those apertures 38' not required for a given terminal pin configuration are temporarily sealed by the metallic base component 12.

Disposed between the circuit tape 16 and metallic base component 12 is a first dielectric sealant 54. The dielectric sealant is preferably an unsupported epoxy sheet. Any suitable sealant which will bond to both the metallic base component and the circuit tape at a temperature sufficiently low to avoid thermal degradation of the dielectric support layer 18 may be used. The dielectric sealant is selected so as not to volatilize during vacuum lamination. Filled epoxies and supported epoxies, as well as other types of polymer adhesives may be used. Other suitable adhesives include silicones and polyimides. A sufficiently low temperature sealing glass may also be employed.

With reference to FIG. 6, a second dielectric sealant 56 is next placed on circuit tape 16. The composition of the second dielectric sealant 56 is defined by the parameters of the first dielectric sealant. The second dielectric sealant should bond and flow in the same cure cycle as the first dielectric adhesive. The second dielectric adhesive must bond to the circuit tape 16, cover component 14 and to the first dielectric sealant 54. Most preferred for the second dielectric sealant 56 is the same unsupported epoxy sheet preferred for the first dielectric sealant. Any suitable adhesive such as those listed for the first dielectric adhesive may be utilized. The thickness of the second dielectric sealant is sufficient to prevent the heads 58 of terminal pins 28 from contacting the cover component 14 after bonding. When cover component 14 is metal, the second dielectric sealant 56 forms an insulation layer to prevent shorting out of the terminal pins 28. Typically, the head of the terminal pins extend about zero to 10 mils above the circuit tape 16 and the thickness of the second adhesive 56 is from about 5 to about 20 mils.

The cover plate 42 is then placed in contact with cover component 14. A downward pressure is applied to the pin grid array assembly as a result of the weight of the cover plate or the downward pressure of the upper platen of a press. The assembly is heated to a temperature sufficient to cause the first dielectric sealant 54 and the second dielectric sealant 56 to flow and bond to the metallic base component 12, circuit tape 16 and cover component 14 as well as to each other.

The cover plate 42 preferably includes a protrusion 60 which extends into the cavity plate aperture 34. The depth 44 of penetration determines the thickness of the assembled package. Each assembled pin grid array package has the same thickness.

A vacuum fixture 46 contacts the second side of the grid plate 36. Gasket 48 ensures a vacuum tight seal. A vacuum 50 draws down on the package base as the pin grid array assembly is heated and during the bond cycle. The apertures 38' transmit the vacuum to the metallic base holding the base against the grid plate 36. Those apertures 38 in alignment with the holes 30 transmit the vacuum to the first dielectric sealant 54. When the first dielectric sealant begins to flow due to heat, the vacuum 50 draws the dielectric sealant into the array of holes formed in the base component 12. The enhanced draw down of dielectric due to vacuum lamination better isolates the terminal pins 28 in the metallic base component 12.

As the first 54 and second 56 dielectric sealants are heated, reaction by-products and volatile contaminants are driven off the adhesive. Due to vacuum 50, a significant portion of these contaminants are removed from the vicinity of the pin grid array assembly. The contaminants are not available to combine with water and form corrosive reactants.

When the bonding cycle is complete, the package is allowed to cool, preferably under vacuum. The vacuum is then broken and the assembled PGA is removed from the fixture.

Vacuum lamination is not limited to adhesively sealed metal pin grid array packages. Low temperature sealing glasses may be substituted for the polymer adhesives. The vacuum lamination may also be applied to glass sealed ceramic pin grid array packages and to molded plastic pin grid array packages.

Figure 7:
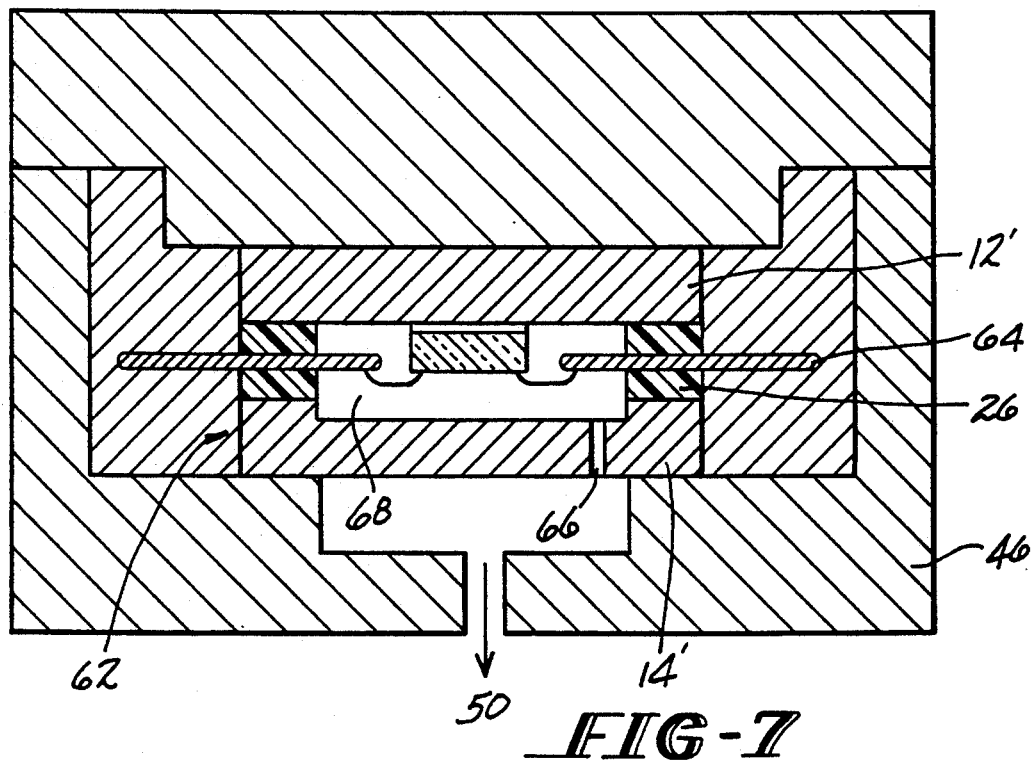
FIG. 7 shows in cross-sectional representation the assembly of a DIP by vacuum lamination in accordance with an embodiment of the invention.

Vacuum lamination is not limited to pin grid array packages. As shown in FIG. 7, the process of the invention is applicable to leaded and leadless DIP, SIP (single in line packages), as well as chip carriers. Any package configuration may further have a window frame component if desired. FIG. 7 shows a DIP package 62 mounted in a vacuum fixture 46. The package comprises a metal or plastic base 12' and a cover 14'. A leadframe 64 is disposed between the base 12' and cover 14'. A dielectric sealant 26 bonds the leadframe 64 to both. A vent hole 66 may be provided so volatilized contaminants are removable from the package cavity 68 by vacuum 50. After the cure cycle is complete, the vent hole 66 is sealed with an epoxy plug. A vent hole may be included in any vacuum laminated package, including the previously described metal PGA.

While the cavity base, cover plate and grid plate are described as being metallic, it is within the scope of the invention to form one or more of the fixture components from a nonmetal such as a high temperature molded plastic or a ceramic.

The patents and patent application described hereinabove are intended to be incorporated in their entireties by reference herein.

It is apparent that there has been provided in accordance with this invention a vacuum lamination fixture for the manufacture of pin grid array packages and an assembly process for vacuum laminated electronic packages which satisfy the objects, features and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

I claim:

1. A process for the manufacture of a pin grid array package, comprising the steps of:
    (a) providing a package assembly, comprising:
        a base component having an ordered array of holes;
        a cover component;
        a circuit disposed between said base and cover component, said circuit having an array of terminal pins electrically connected thereto, said terminal pins passing through said ordered array of holes; and
        a dielectric sealing means disposed between said base component and said circuit and between said cover component and said circuit;

(b) supporting said base component on a first side of a grid plate, said grid plate having a plurality of holes for receiving said terminal pins; and (c) heating said package assembly while at essentially the same time applying a vacuum to a second side of said grid plate, said package assembly temperature and said vacuum being sufficient to cause said dielectric sealing means to flow into said ordered array of holes and to bond said base component to said circuit and said cover component to both said circuit and said base component.

2. The process of claim 1 wherein said dielectric sealing means is a polymer adhesive selected from the group consisting of benzocyclobutene, bismaleimide triazine, cyanate triazine, cyanate ester, phenolic, polyether imide, silicone, polyimide and epoxy.

3. The process of claim 2 wherein said dielectric sealing means is an unfilled epoxy.

4. The process of claim 2 including supporting said grid plate on a cavity plate, said cavity plate having at least one aperture for receiving said package assembly.

5. The process of claim 4 wherein said at least one aperture has both a length and width from about 0.005 inches to about 0.015 inches larger than that of said base component.

6. The process of claim 4 wherein said plurality of holes in said grid plate are arranged in a uniform array.

7. The process of claim 6 wherein said plurality of holes in said grid plate are located on 0.100 inch centers.

8. The process of claim 6 wherein said plurality of holes in said grid plate are located on 0.050 inch centers.

9. The process of claim 6 including providing said grid plate with a thickness effective to support said terminal pins.

10. The process of claim 9 wherein the thickness of said grid plate is from about 50 mils to about 200 mils.

11. The process of claim 9 including providing a cover plate to seal said at least one aperture.

12. The process of claim 11 wherein said cover plate is provided with at least one protrusion to seal said at least one aperture, said protrusions having a depth effective to apply a uniform pressure to the cover component of said package assembly.

13. The process of claim 11 including applying a vacuum pressure of less than 10 mm/Hg.

14. The process of claim 13 including applying a vacuum pressure of from about 1 to about 5 mm/Hg.

15. The process of claim 13 wherein said package assembly is disposed between heated platens which apply a uniform pressure to said package assembly.

16. The process of claim 15 wherein said uniform pressure is from about 200 psi to about 1000 psi.

17. The process of claim 15 wherein said package assembly is heated to a temperature in the range of from about 175° C. to about 200° C.

* * * * *